United States Patent [19]
Penndorf

[11] Patent Number: 6,117,703
[45] Date of Patent: Sep. 12, 2000

[54] PROCESS AND DEVICE FOR PRODUCING A CIS-STRIP SOLAR CELL

[75] Inventor: Juergen Penndorf, Hohenwalde, Germany

[73] Assignee: IST - Institut fuer Solartechnologien GmbH, Frankfurt an der Oder

[21] Appl. No.: 09/254,098

[22] PCT Filed: Aug. 21, 1997

[86] PCT No.: PCT/DE97/01832

§ 371 Date: Mar. 1, 1999

§ 102(e) Date: Mar. 1, 1999

[87] PCT Pub. No.: WO98/09337

PCT Pub. Date: Mar. 5, 1998

[30] Foreign Application Priority Data

Aug. 27, 1996 [DE] Germany ............ 196 34 580

[51] Int. Cl.[7] ............................................. H01L 31/18
[52] U.S. Cl. ................ 438/63; 438/73; 136/249; 136/264; 257/431
[58] Field of Search ................ 136/249, 264; 205/227; 438/63, 73

[56] References Cited

U.S. PATENT DOCUMENTS

| | | | |
|---|---|---|---|
| 4,536,607 | 8/1985 | Wiesmann | 136/249 |
| 4,581,108 | 4/1986 | Kapur et al. | 204/37.1 |
| 5,695,627 | 12/1997 | Nakazawa et al. | 205/227 |

FOREIGN PATENT DOCUMENTS

| | | | |
|---|---|---|---|
| 0574716 A1 | 12/1993 | European Pat. Off. | H01L 31/06 |
| 4103291 | 4/1992 | Germany | H01L 31/18 |
| 4225385 | 2/1994 | Germany | H01L 31/18 |
| 2-244772 | 9/1990 | Japan | H01L 31/04 |

OTHER PUBLICATIONS

Copper indium diselenide thin film solar cells fabricated on flexible foil substrates; Basol et al. NL–Z: Solar Energy Materials and Solar Cells, vol. 29, 1993, pp. 163–173.

Primary Examiner—Olik Chaudhuri
Assistant Examiner—Douglas A. Wille
Attorney, Agent, or Firm—Karl Hormann

[57] ABSTRACT

The invention relates to a method of fabricating a strip CIS solar cell and an apparatus for practicing the method. It is the task of the invention to describe a method and an apparatus for providing a technical solution as well as the required layer structure, by which it is possible economically to fabricate adhering CIS solar cells on copper strips. In accordance with the invention the task is solved by a first step of continuously galvanically coating one side of a pre-cleaned copper strip with indium, a second step of very quickly heating the copper strip coated with indium by a contact method with a heated body of graphite and to bring one side into contact with a heated sulfur or selenium containing carrier gas in a narrow gap, a third step of selectively removing by an etching technique the generated cover layer of copper sulfide or selenide, and a fourth step of providing a p$^+$ conductive transparent collector or planarizing layer of copper oxide/sulfide. It is a further object of the invention to develop a reactor for practicing the method. The reactor consists of a strip heater made of graphite convexly curved at its gapped surface, a gas heater also made of graphite concavely curved at the gapped surface and quartz glass plates which close a gap set between the strip heater and the gas heater toward the exterior. The strip heater and the gas heater may be separately heated from their interior or their exterior to the necessary process temperatures by radiation heaters.

9 Claims, 1 Drawing Sheet

PROCESS AND DEVICE FOR PRODUCING A CIS-STRIP SOLAR CELL

BACKGROUND OF THE INVENTION

1. Field of the Invention

The invention relates to a method of fabricating strip solar cells on the basis of copper strips coated on one side with CIS (copper indium diselenide) and a homologous substance, and an apparatus suitable therefor.

2. The Prior Art

At present, the ecologically friendliest but also dearest variant of alternative energy generation is based upon photovoltaic modules. The possibilities of further reducing the costs of currently used solar modules based on monocrystalline and polycrystalline silicon are limited owing to the use of the necessary materials. So-called thin-layer solar cells offer the greatest potential for cost reduction. At required coating thicknesses for the active absorber of at the most 2–4 µm, even the use of such expensive materials as indium, gallium and selenium is of subordinate importance. Hitherto, their low attainable efficiency has impeded the large-scale use of thin-layer solar cells. However, in recent years significant progress has been made in this respect, so that thin-layer solar cells, in particular those based on $CuInSe_2$ (CIS) with attained modular efficiency degrees of about 10% are at their pilot phase.

However, such degrees of modular efficiency are dependent upon cellular efficiencies of 12–14% which can be ensured only by an exact control of the technological parameters in correspondingly expensive equipment. In-line sputtering, vapor deposition and tempering equipment have conventionally been used for fabricating CIS modules; but the high depreciation costs of such equipment limit the cost reducing potential of these thin-layer technologies. Moreover, because of the geometry of such equipment, only relatively narrow solar panels (usually about 30 cm) with small variations can be fabricated. Larger equipment which would permit an effective production of larger thin-layer modules, is extremely expensive and would require production volumes which at present could not be sold, even on a world-wide basis. An interesting technological starting point for circumventing those problems resides in coating foils with solar cells and the subsequent connection of individual foil sections by an overlapping mounting technique of which an effective variant is described in Japanese Patent 2-244, 772 (A). This variant is particularly interesting where metal emitter electrodes are dispensed with. In contrast to Japanese Patent 2-244,722 (A), 100% of the surface of the module aperture could be used in such a variant (see FIG. 1). However, the width of the cell would be limited to about 1 cm because of the resistance of the upper collector electrode made of a transparent conductive oxide.

An economic production of solar cells and modules in such an arrangement would require enormously high production rates in the fabrication of cells in order in the time it takes in conventional planar technology to produce comparable surfaces comparable. In NL-Z: Solar Energy Materials and Solar Cells, Vol. 29, 1993, pp. 163–173, German Patent 4,335,385 as well as German Patent 4,103,291 there are described methods of making ternary semiconductor surface layers in which CIS solar cells are fabricated on flexible strip-like substrates. As disclosed, layers of copper and indium are applied individually or simultaneously by conventional techniques and are subsequently reacted with a third component. Another method based upon the subsequent conversion of oxide starter components in a sulfur or selenium gas flow, is described in European Patent 0,574, 716 A1. For improving functional parameters, the fabricated CIS absorber layers may be combined with selective etching steps for the removal of interfering copper selenides or sulfides, as described in Japanese Patent specification JP6-29,560.

None of the currently known CIS technologies can, however, satisfy the high production demands placed upon the mentioned strip technology. Also, the application of current cell structures (FIG. 2) would require the use of expensive molybdenum strips or metal strips coated with molybdenum, as substrates. Moreover, the weak adherence of CIS layers on molybdenum surfaces constitutes a hitherto unsolved problem mitigating against a strip technology subjected to high mechanical stresses. The use of substantially cheaper copper strips as supports for CIS solar cells in which the upper surface of the copper strip substrate would be part of the solar cell would constitute an interesting alternative. This is made impossible, however, because the copper strip substrate constitutes a practically infinite Cu diffusion source. In this connection, an exact control of the composition of the CIS layers, indispensable for effective solar cells, is not possible.

OBJECT OF THE INVENTION

It is, therefore, a task of the present invention to provide a method and a solution in terms of technological equipment necessary therefor, as well as the requisite layer structure, which permits a highly efficient and economical deposit of securely adhering CIS solar cells on copper strips.

SUMMARY OF THE INVENTION

In accordance with the invention, the task is solved by, a first step of continuously (reel to reel) galvanically coating one side of a previously cleaned copper strip with indium, gallium or In-Ga alloys, a second step of very quickly and continuously heating the copper strip coated with indium, gallium or In-Ga alloys by contact with a heated body of graphite and in a narrow gap contacting one side with a heated carrier gas containing sulfur or selenium, a third step of selectively etching away the grown layer of copper sulfide or selenide, and a fourth step applying a $p^+$conductive transparent collector and planarizing layer of copper oxide or sulfide.

The galvanic deposit of indium on copper is a highly economical and quick process which has been technically mastered and which allows reproducibly and precisely to set the thickness of the layer of indium at a most sparing use of material. The necessary baths are commercially available. The one-sided continuous coating is realized by guiding the copper strip over a guide roll partially submerged in the galvanic bath. It may be useful to combine the cathodic deposit of indium with a preceding anodic cleaning of the copper surface in diluted ortho phosphoric acid. For sulfurizing, the copper strip coated with indium is heated within a few seconds to 550–560° C. by drawing it over a radiation-heated surface-rounded block of graphite and by contacting it with nitrogen carrier gas saturated with sulfur or selenium vapor. The basic structure of the reactor advantageously used for this process is shown in FIG. 3. The reactor consists of the strip graphite heater 1 having a convexly curved surface with a slot therein, a heater 2 for the gas also made of graphite and provided with a slotted concavely curved surface, and quartz glass plates 3 which close the gap 4 set between the strip heater and the gas heater to the exterior. The strip and gas heaters may be separately heated to the requisite process temperatures from their interiors or exteriors by thermally rapid radiation heaters 5.

The advantages of equipment arranged in this manner are:

ensuring rapid and continuous heat transfer into the strip without rotating heated components, by making use of the good sliding and heat conducting properties of graphite;

high efficiency in the use of material by the narrowly limited and precisely defined reaction chamber;

ensuring high reactivity of selenium and sulfur by temperatures within the gas heater which are higher than the temperatures of the strip;

simple and inexpensive construction.

The very quick heating of the strip constitutes the physical and chemical basis of the described CIS technology. Drawing upon the different diffusion velocities of In and Cu in their solid (Cu strip) and liquid (In melt) phase, very quick heating (within 0.5 to 10 sec.) leads to very quick saturation of the In melt according to the limiting crystallization temperature of preferably 550–650° C. quickly attained in the Cu–In phase diagram, diffusion of In into the copper strip being of secondary importance. If the copper-saturated, as described above, hot In melt is brought into contact with highly reactive S or Se, conversion to CIS for all intents and purposes occurs instantaneously. In contrast to conventional technologies which for the formation of CIS always rely upon the much slower reaction of solids, process times could be significantly reduced. Therefore, very high strip feed velocities as an essential precondition for an economical strip technology are possible. Very short process times in the order of seconds for sulfurizing or seleniumizing are at any rate an indispensable precondition in view of the fact that because of the practically unlimited source of Cu of the copper strip substrate, at the given process temperatures Cu is constantly after-diffusing. The presence of reactive components such as S or Se at the strip surface leads to the formation of cover layers of copper sulfide or copper selenide which at too long a processing time leads to the destruction of the initially formed continuous or closed CIS layer. In accordance with the prior art, these cover layers of varying thickness inevitably produced during the process have subsequently to be selectively removed by cyanide etching. The CIS layer exposed on the strip surface after etching is free of disturbing foreign phases and has the parameters necessary for absorber layers such as layer thicknesses in the order of 1–2 $\mu$m, columnar structure as well as good optical and electrical properties. It is rigidly grown into the strip substrate and is of the mechanical stability required of strip technology. However, the CIS layers fabricated by the described technology are n conductive to a greater or lesser degree and, therefore, they require a cover layer structure which is completely different from the prior art (FIG. 2). In order to realize the p/n transition required for solar cells the n absorber need be provided with a transparent p$^+$collector or planarizing. According to the state of the art, the only substance suitable therefor is ZnTe which has the requisite optical and electric properties. The inventor's experiments with ZnTe cover layers on copper strips coated with CIS according to the technology herein described prove that it is possible in principle to produce solar cells. However, the currently known technical possibilities of integrating a ZnTe deposition into the strip process are limited. Accordingly, as a superior alternative a highly efficient and very rapid sol-gel technique has been developed in accordance with the invention for fabricating highly conductive transparent p$^+$layers from copper oxide or copper sulfide. The required starting solution is made on the basis of alcoholic or aqueous solutions of copper acetate and thiourea. This solution is continuously applied to the cyanide-etched CIS surface by a simple method of submersion and is tempered in a matter of seconds by a contact method at temperatures from about 250 to about 450° C. CIS solar cells on a sulfide basis fabricated in this manner display the open circuit voltages and short-circuit currents requisite of highly efficient solar cells. Since the $Cu_2O$ or $Cu_2S$ cover layer with its absorption edge limits the effectiveness of the CIS solar cells, it is reasonable to use this layer as a thin planarizing layer in combination with a conventional ZnO collector layer. Between the p$^+$- $Cu_2O$ or $Cu_2S$ planarizing layer, as the case may be, and the n$^+$-ZnO collector layer there is formed, in electronic terms, a tunnel diode which, analogous to experience in the fabrication of pin structures on the basis of amorphous silicon, has only a limited affect upon the properties of the solar cell. The basic layer structure of the solar cell made in accordance with the technology here described is shown in FIG. 4.

DESCRIPTION OF THE SEVERAL DRAWINGS

The invention will hereinafter be described in greater detail on the basis of an embodiment. In the appended drawings.

DETAILED DESCRIPTION OF PREFERRED EMBODIMENTS

Figure 1:
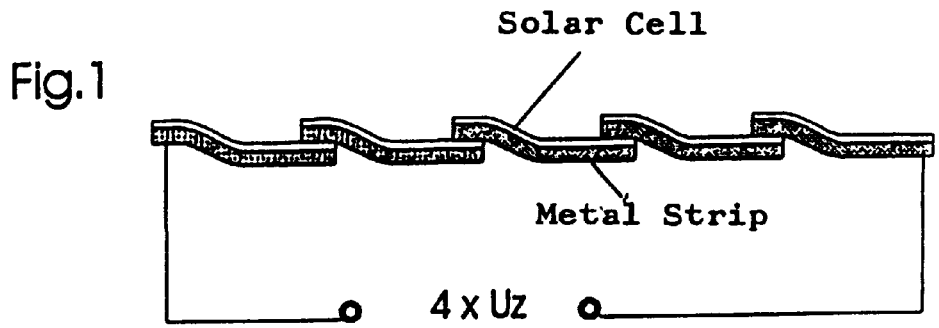
FIG. 1 depicts a preferred modular switching concept of strip solar cells.
Figure 2:
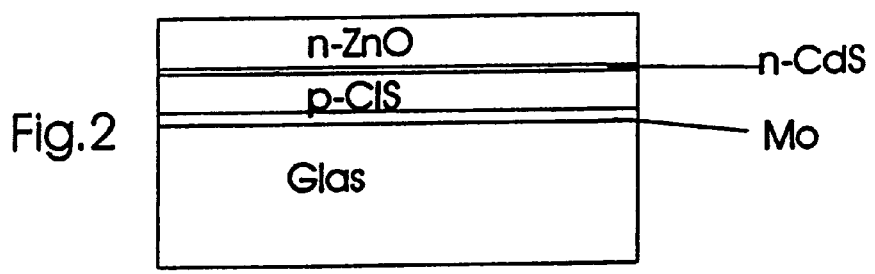
FIG. 2 depicts the prior art with respect to the structure of CIS solar cells.
Figure 3:
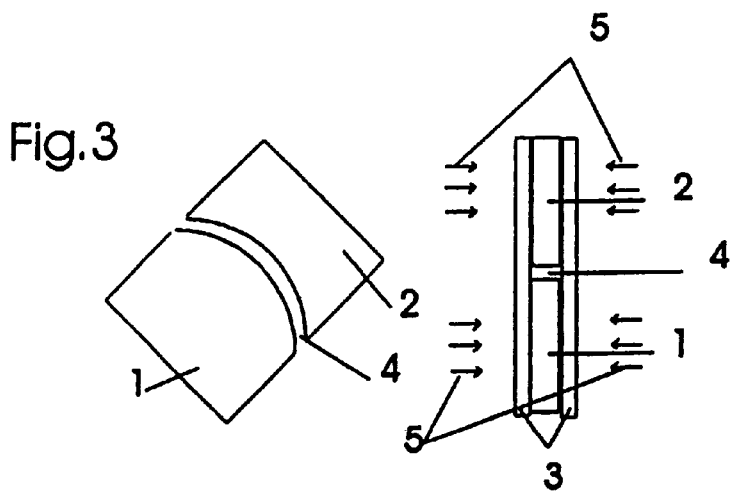
FIG. 3 depicts the basic structure of the narrow gap reactor for fabricating strip CIS solar cells in accordance with the present invention; (1=strip heater made from graphite; 2=gas heater made from graphite; 3=quartz glass plates; 4=reactor gap; 5=radiation heater)
Figure 4:
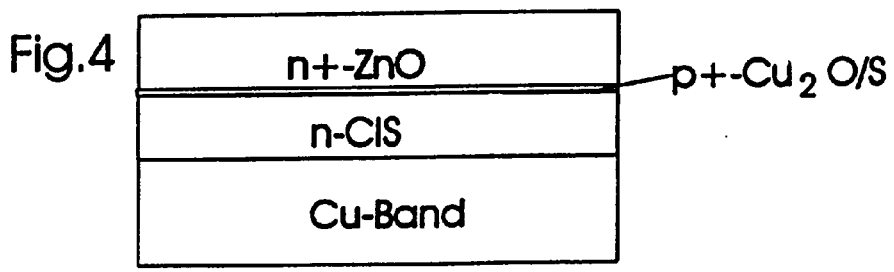
FIG. 4 depicts the structure of a strip CIS solar cell in accordance with the invention.

The starting material is a commercially available copper strip of 1 cm width and 0.1 mm thickness wound on a reel. For cleaning, the strip is anodically etched in a combined strip apparatus in phosphoric acid heated to 50° C. and diluted to 50% and immediately thereafter is cathodically provided on one surface with a layer of In 1 $\mu$m thick.

Sulfuric aqueous In electrolyte is used as the galvanic bath.

The coated strip is thereafter heated to 580° C. in a radiation heated gap reactor and is sulfurized in the flow of nitrogen carrier gas saturated by sulfuric vapor. The temperature of the gas heater is 700° C. and the strip feed velocity is 10 cm/sec. The carrier gas is saturated with sulfuric vapor at 350° C. within a radiation heated source of sulfur. The reaction gap has a height of 1 mm, a width of 12 mm and a length of 30 cm.

Subsequently, the $Cu_2S$ cover layer is selectively etched away in a continuous process in a strip etching apparatus in a 10% KCN solution heated to 80%.

Finally, the CIS layer is provided with a planarizing and collector layer of $Cu_2O$ or $Cu_2S$ by applying in a strip apparatus a sol solution of methanol, thiourea and copper acetate, by submersion coating, to one surface of the CIS coated copper strip and subsequent immediate tempering by drawing over the a graphite block heated to 300° C.

What is claimed is:

1. A method of fabricating a strip CIS solar cell, comprising the steps of:

providing a strip of copper of predetermined length;

galvanically coating, in a continuous operation, a surface of the strip with one of indium, gallium and an alloy of indium and gallium;

contact heating the coated strip to a temperature in the range from about 550° C. to about 650° C. within a predetermined time;

contacting the coated surface with a heated carrier gas containing one of sulfur and selenium thereby to produce a CIS layer with a layer of one of copper sulfide and copper selenide thereon;

selective removing said layer one of copper sulfide and copper selenide by etching;

providing on the CIS layer by a sol-gel technique a $p^+$ conductive transparent collector strip of one of copper-(I)-oxide, copper sulfides, a mixture of copper-(I)-oxides and copper sulfides, and zinc oxide.

2. The method of claim 1, wherein the copper strip is wound on a first reel and wherein the continuous galvanic coating is performed by feeding the strip through a galvanic bath to a second reel.

3. The method of claim 1, wherein the copper strip is subjected to cleaning in diluted phosphoric acid before the galvanic coating.

4. The method of claim 1, wherein the predetermined time is from about 0.5 to about 10 seconds.

5. The method of claim 1, wherein the selective etching is performed by cyanide etching.

6. The method of claim 1, wherein the collector strip is formed by applying a solution of copper acetate and thiourea onto the etched CIS surface and is tempered by contact heat of about 250° C. to about 450° C. within about 1 to about 5 seconds.

7. Apparatus for heating the strip of claim 1 to about 550° C. to about 650° C., comprising a graphite block adapted to be heated by radiation heat and provided with a convexly curved surface for sliding the strip thereacross.

8. The apparatus of claim 7, further comprising means for heating a carrier gas by radiation heat including a concavely curved surface opposite the convexly curved surface to for a gap for feeding the strip therethrough.

9. The apparatus of claim 8, further comprising first and second plates of quartz glass for enclosing the gap.

* * * * *